United States Patent

[11] 3,628,152

[72] Inventor David J. Carlson
Indianapolis, Ind.

[21] Appl. No. 14,762

[22] Filed Feb. 25, 1970

[45] Patented Dec. 14, 1971

[73] Assignee RCA Corporation
Continuation of application Ser. No. 756,601, Aug. 30, 1968, now abandoned. This application Feb. 25, 1970, Ser. No. 14,762

[54] TELEVISION TUNING CIRCUIT UTILIZING VOLTAGE VARIABLE CAPACITANCE

9 Claims, 5 Drawing Figs.

[52] U.S. Cl. .......... 325/383, 325/318, 325/453, 325/459, 325/464, 330/21, 330/29, 331/117 D, 331/117 R, 331/177 V, 334/15

[51] Int. Cl. .......... H04b 1/18

[50] Field of Search .......... 330/21, 31; 331/86 C, 177 V; 334/15, 78–84, 40; 333/70; 325/318, 379, 383, 452, 454, 459, 462, 464, 465, 373, 377

[56] References Cited

UNITED STATES PATENTS

| | | | |
|---|---|---|---|
| 1,869,870 | 8/1932 | Stevenson .......... | 325/379 |
| 3,210,681 | 10/1965 | Rhodes .......... | 330/21 X |
| 2,661,459 | 12/1953 | Schmidt, Jr. .......... | 334/61 X |
| 3,068,427 | 12/1962 | Weinberg .......... | 334/15 X |
| 3,319,188 | 5/1967 | Brutsch .......... | 331/177 V X |

FOREIGN PATENTS

| | | | |
|---|---|---|---|
| 673,494 | 11/1963 | Canada .......... | 334/78 |

*Primary Examiner*—Herman Karl Saalbach
*Assistant Examiner*—Paul L. Gensler
*Attorney*—Eugene M. Whitacre

ABSTRACT: A tunable resonant circuit includes a pair of inductors serially connected between input and output terminals. The parallel combination of a third inductor and a voltage-responsive capacitance device are coupled from the junction of the pair of inductors to a point of reference potential.

Patented Dec. 14, 1971 3,628,152

3 Sheets-Sheet 1

INVENTOR

DAVID J. CARLSON

BY

Attorney

INVENTOR

DAVID J. CARLSON

BY [signature]

Attorney

INVENTOR
DAVID J. CARLSON
BY [signature]
Attorney

TELEVISION TUNING CIRCUIT UTILIZING VOLTAGE VARIABLE CAPACITANCE

This application is a continuation of application Ser. No. 756,601, filed Aug. 30, 1968, now abandoned.

The present invention relates to tunable resonant circuits, and more particularly, to resonant circuits adapted for tuning over a wide frequency range by variable capacitors such as variable-capacitance diodes.

The bandwidth of a parallel resonant circuit is inversely proportional to the product of its shunt capacitance and resistance, and consequently, when a parallel resonant circuit is tuned by a variable capacitance, it will change its bandwidth inversely with the change in tuning capacitance. For this reason, where a relatively wide frequency range is to be tuned, and economy of the tuning circuits is important, it is common to tune resonant circuits by varying the inductance to maintain a substantially constant bandwidth as the circuit is tuned throughout its frequency range.

The use of variable capacitors such as voltage-dependent variable-capacitance diodes as the capacitive tuning elements for tuning resonant circuits over wide frequency bands creates problems because the capacitance variation alters the bandwidth of the circuit as noted above. In addition, with voltage-dependent variable-capacitance devices the resistance of the device may also change with variations of control voltage, aggravating the bandwidth change problem. The range of capacitance available from most voltage-responsive capacitance devices is somewhat limited and makes the design of wide band tuners extremely difficult with economically feasible capacitance diodes.

A tunable resonant circuit embodying the present invention includes an impedance providing at least a resistive component with a first and a second inductive element coupled across the impedance. A variable tuning capacitor is coupled across the first inductive element. The parameters of the first and second inductive element and the variable capacitor are selected to tune across a band of frequencies as the capacitance of the variable capacitor varies from a first predetermined value to a second predetermined value. The parameters of the second inductive element and the variable capacitor are further selected in conjunction with the parameters of the resistive component such that when the variable capacitor is adjusted to exhibit a capacitance to tune the circuit to a frequency within the band of frequencies, the circuit maintains a substantially constant bandwidth.

Figure 1:
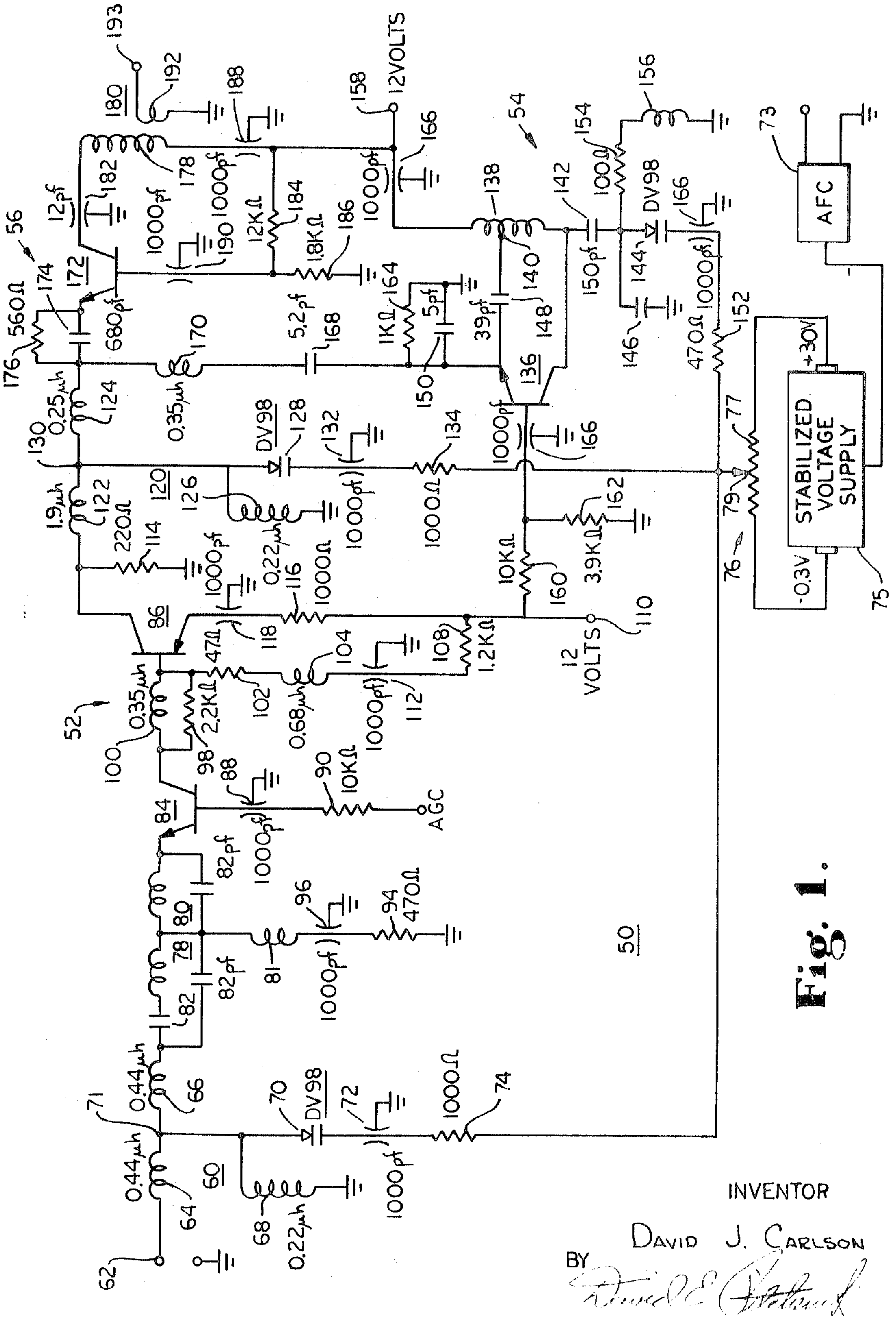
Figure 2A:
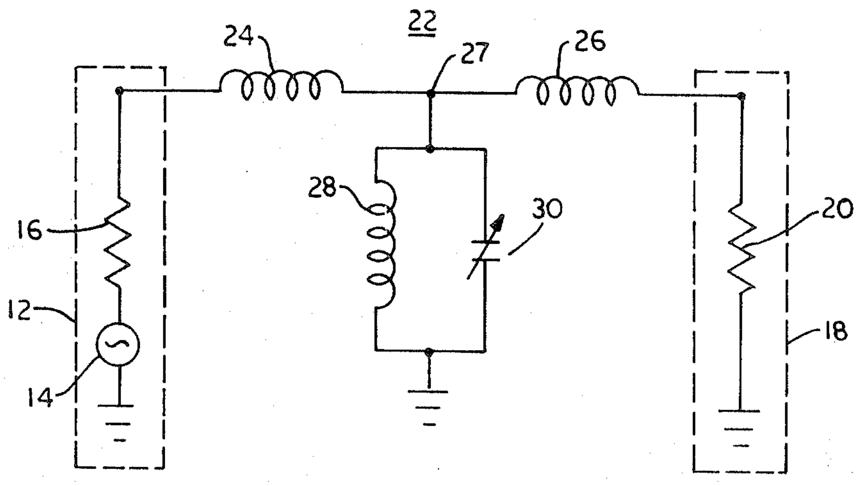
Figure 2B:
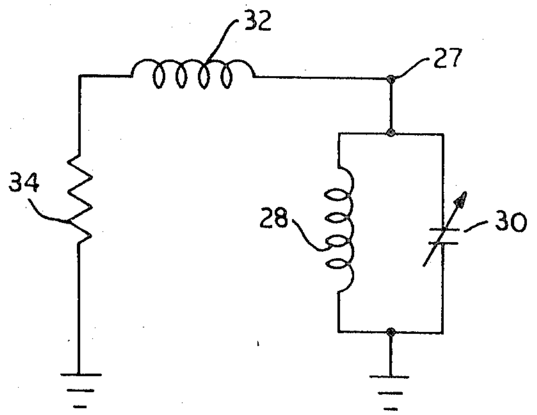
Figure 2C:
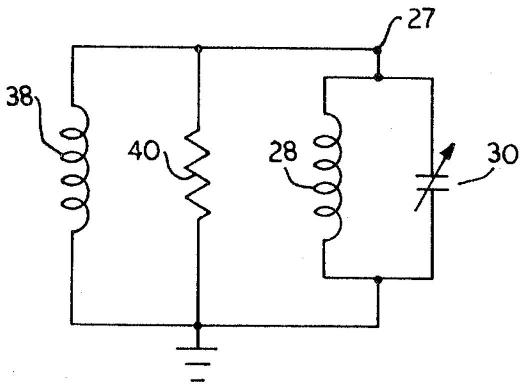
Figure 3:
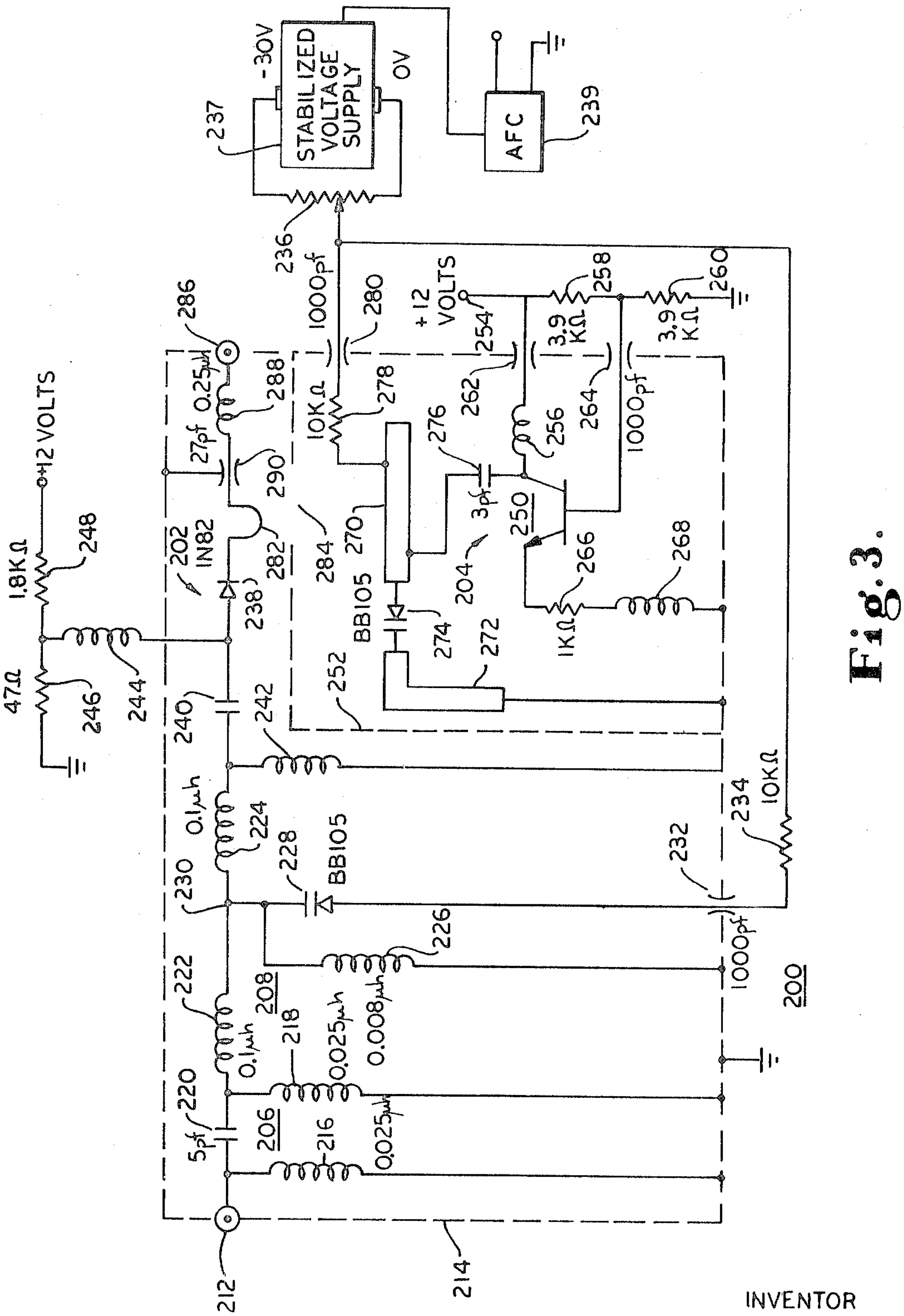

The novel features of the invention are set forth with particularity in the appended claims. The invention, both as to its organization and manner of operation, may best be understood by reference to the following description, when taken in conjunction with the accompanying drawings, in which:

FIG. 1 is a schematic circuit diagram of a VHF television tuner embodying the invention;

FIG. 2*a* is an equivalent circuit diagram of the tunable circuits of the VHF tuner shown in FIG. 1;

FIG. 2*b* is a schematic circuit diagram with the source, load and interconnecting impedances shown in FIG. 2*a* combined into a single circuit branch;

FIG. 2*c* is a schematic circuit diagram with the series impedances shown in FIG. 2*b* converted to the equivalent shunt impedance; and FIG. 3 is a schematic circuit diagram of a UHF television tuner embodying the invention.

Referring now to FIG. 1, a tuner 50 includes an RF amplifier stage 52, an oscillator stage 54, and a mixer stage 56. The tuner 50 is of the type wherein the RF signals from the amplifier stage 52 and the locally generated signals from the oscillator stage 54 are heterodyned in the mixer stage 56 to produce an IF signal which may be processed by IF signal processing circuits, not shown.

RF signals are intercepted by an antenna (not shown) and are coupled to a capacitively tuned circuit 60 through a terminal 62. The circuit includes two serially connected inductors 64 and 66 which interconnect the antenna terminal 62 and IF rejection circuits. An inductor 68 and a tuning capacitor 70, shown as a variable-capacitance diode, are connected to the junction 71 of the two inductors 64 and 66. The inductor 68 is connected to a point of reference potential, shown as ground, and the variable-capacitance diode 70 is connected to the point of reference potential for radiofrequencies by means of a feedthrough capacitor 72.

The capacitively tuned circuit 60 has circuit components apportioned so that it will be resonant across a band of frequencies ranging from 216 MHz to 54 MHz with a substantially constant bandwidth. Tuning of the circuit 60 is controlled by the direct voltage applied to the diode 70 via resistor 74. The resistor 74 is connected to a voltage divider circuit 76 which is the source of tuning potential for the diode 70. The divider circuit 76 includes a resistor 77, connected at its ends to a stabilized voltage supply 75, and a variable tap 79. The stabilized supply may be designed to develop a voltage of +30 volts and −0.3 volts at two output terminals. The range of voltage required, however, is dependent upon the specific type of variable-capacitance diode used.

Automatic frequency control for the tunable resonant circuits of the tuner 50 may be provided by a suitable automatic frequency control circuit 73, shown in block diagram form. It is desirable to provide AFC for all the Varicap tunable resonant circuits of the tuner 50 to correct detuning of the resonant frequency of the circuits due to diode capacitance variations, as for example, with temperature change. Changes in the voltage applied to the diode 70 are effected by the AFC circuit to maintain the intermediate frequency signal from the mixer 56 at the desired frequency. The DC circuit loop for the diode 70, beginning at a point of reference potential, passes through the AFC circuit 73, the stabilized voltage supply 75, the divider circuit 76, and the resistor 74 to the cathode of the diode 70. The DC loop is completed through the inductor 68 which interconnects the anode of the diode 70 and the point of reference potential.

The inductor 66 is coupled to the RF amplifier stage 52 by an IF rejection circuit. Included in the IF rejection circuit are the series combination of two parallel resonant circuits 78 and 80. The inductor and capacitor associated with each of the circuits 78 and 80 is apportioned to be resonant at television intermediate frequencies. A capacitor 82 is connected in series with the inductors associated with the IF rejection circuits 78 and 80 to prevent any DC from the diode 70 control circuit from flowing through the inductors of the IF rejection circuits into the RF amplifier stage 52. At frequencies higher than IF, the series connected capacitors of the IF rejection circuits 78 and 80 in association with the inductor 81 act as a high-pass filter.

The RF amplifier stage 52 includes two transistor amplifiers 84 and 86. Transistor 84 is connected in the common base configuration, having its base electrode connected to the point of reference potential for radiofrequencies by means of a feedthrough capacitor 88. An automatic gain control voltage (AGC) is applied to the base electrode of the transistor 84 via resistor 90. The emitter electrode of the transistor 84 is connected to the IF rejection circuit 80, and to the point of reference potential through the series circuit including the inductor associated with the IF rejection circuit 80, the inductor 81, and a bias resistor 94. The bias resistor 94 is bypassed for radio signal frequencies by a feedthrough capacitor 96.

The collector electrode of the transistor 84 is coupled to the base electrode of the transistor 86 by a high-frequency peaking network. Included in the network are the parallel combination of a resistor 98 and an inductor 100, interconnecting the collector electrode of the transistor 84 and the base electrode of the transistor 86. The series combination of a resistor 102, an inductor 104, and a resistor 108, interconnect the base electrode of the transistor 86 and a terminal 110. The terminal 110 is adapted to be energized by a source of operating potential for the tuner. The resistor 108 is bypassed to the point of reference potential for radiofrequencies by the feedthrough capacitor 112.

The amplified RF signals from the amplifier stage 52 are developed across a load resistor 114 coupled between the collector electrode of the transistor 86 and the point of reference potential. The emitter electrode of the transistor 86 is connected by a resistor 116 to the source of operating potential applied at the terminal 110. The resistor 116 is bypassed to the point of reference potential for radiofrequencies by a feedthrough capacitor 118.

A capacitively tuned circuit 120 is coupled to the collector electrode of the transistor 86. The circuit includes two serially connected inductors 122 and 124 which interconnect the collector electrode of the transistor 86 and the mixer stage 56. An inductor 126 and a tuning capacitor 128, shown as a variable capacitance diode, are connected to the junction 130 of the two inductors 122 and 124. The inductor 126 is connected to the point of reference potential, and the variable-capacitance diode 128 is connected to the point of reference potential for radiofrequencies by means of a feedthrough capacitor 132.

As in the case with the capacitively tuned circuit 60, the capacitively tuned circuit 120 has circuit components apportioned so that it will resonate across a band of frequencies ranging from 216 to 54 MHz with a substantially constant bandwidth. Tuning of the circuit 120 is controlled by the direct voltage applied to the diode 128 via resistor 134. The resistor 134 is connected to a voltage divider circuit 76 which is the source of tuning potential for the diode 128. The DC circuit loop for the diode 128, beginning at the point of reference potential, passes through the AFC circuit 73, the stabilized voltage supply 75, the divider circuit 76, and the resistor 134 to the cathode of the diode 128. The DC loop is completed through the inductor 126 which interconnects the anode of the diode 128 and the point of reference potential.

The local variable-capacitance stage 54 includes a transistor 136 which has a capacitively tunable resonant circuit connected to its collector electrode. Included in the resonant circuit are an inductor 138 with a tap connection 140, a capacitor 142, a variable-capacitance diode 144 and a trimmer capacitor 146. Two capacitors 148 and 150 are serially connected between the inductor tap 140 and the point of reference potential. The junction of the capacitors 148 and 150 is connected to the emitter electrode of the transistor 136. The capacitor 148 provides a regenerative feedback path between the oscillator tank circuit and the emitter electrode of the transistor. The voltage developed at the tap connection 140 is divided down by the voltage divider effect of the capacitors 148 and 150.

A resistor 152 interconnects the cathode of the diode 144 and the source of tuning potential 76. The DC circuit loop for the diode 144, beginning at the point of reference potential, passes through the AFC circuit 73, the stabilized voltage supply 75, the divider circuit 76, and the resistor 152 to the cathode of the diode 144. A lossy choke, shown as a resistor 154 and an inductor 156, complete the DC loop by interconnecting the anode of the diode 144 and the point of reference potential.

DC bias for the oscillator transistor 136 is obtained from a source of operating potential connected to a terminal 158. The source of operating potential may be the same as that employed to energize the terminal 110. The base electrode of the transistor 136 is connected to the source of operating potential through a voltage-dividing network including the resistors 160 and 162 connected between the terminal 110 and the point of reference potential. A resistor 164 interconnects the emitter electrode of the transistor 136 and the point of reference potential. The collector electrode of the transistor 136 is connected to the source of operating potential by the inductor 138. Several feedthrough capacitors 166 bypass radiofrequency signals to the point of reference potential thereby completing the radiofrequency paths in the oscillator circuit.

An injection circuit interconnects the mixer stage 56 and the oscillator stage 54. Specifically, the injection circuit includes a capacitor 168 and an inductor 170 serially connected between the emitter electrode of the transistor 136 and inductor 124 of the capacitively tuned RF circuit 120.

Both the RF signals and the locally generated signals are coupled to the emitter electrode of a transistor 172 in the mixer stage 56 by a coupling capacitor 174. A bias resistor 176 is connected in parallel with the coupling capacitor 174. The RF signals and the locally generated signals are heterodyned in the transistor 172 to provide IF signals at the transistor 172 collector electrode.

The collector electrode of the transistor 172 is connected to the source of operating potential at the terminal 158 by the primary winding 178 of a transformer 180. The base electrode of the transistor 172 is connected to the source of operating potential at the terminal 158 by a voltage-dividing network including the resistors 184 and 186. Two feedthrough capacitors 188 and 190 bypass signal frequencies to the point of reference potential to complete the signal frequency circuit path. The primary of the transformer 180 is tuned to IF signal frequencies by a feedthrough capacitor 182. The secondary winding 192 of the transformer 180 is coupled to IF signal processing circuitry, not shown.

By adjusting the tap 79, the voltage applied to the variable-capacitance diodes 70, 128 and 144 is varied to select any one of the VHF television channels. Specifically, the tunable circuits 60 and 120 resonate in the VHF television band of 216 to 54 MHz, and the oscillator circuit resonates in a range from 257 to 101 MHz as is required for proper heterodyne action in the mixer stage 56. It should be noted that since all the variable-capacitance diodes obtain their bias from one supply, a "-ganging" effect is achieved in tuning the capacitively tuned circuits.

The operation of the VHF tuner shown in FIG. 1 can best be understood by considering the equivalent circuit diagram of the tunable resonant circuits associated with the tuner.

In a parallel tuned resonant circuit, the figure of merit $Q_p$ can be expressed in the form $Q_p=R_p/X_c$ where $R_p$ is the shunt resistance and $X_c$ is the shunt capacitive reactance. $Q_p$ can also be expressed in the form $Q_p=f_0/BW$ where $f_o$ is the resonant frequency of the parallel tuned circuit and $BW$ is the bandwidth of the parallel tuned circuit. By equating both expressions for $Q_p$ the following relationship obtains:

$$f_0/BW=R_p/X_c$$

however, the capacitive reactance $X_c$ can be expressed in the form:

$$X_c=1/2\pi f_0C$$

by making appropriate substitutions for $X_c$ the equation becomes:

$$\frac{f_0}{BW}=\frac{R_p}{\frac{1}{2\pi f_0 C}}$$

solving for bandwidth and cancelling like terms the equation takes the form:

$$BW=1/2\pi R_pC$$

From the equation $BW=1/2\pi R_pC$ it can be observed, as previously indicated, that the bandwidth of a parallel tuned resonant circuit varies inversely with the tuning capacitance. As the capacitance varies from maximum capacity at the lowest frequency to which the parallel tuned circuit is resonant, to minimum capacity at the highest frequency to which the parallel tuned circuit is resonant, the bandwidth of the circuit becomes progressively larger.

To offset the change in bandwidth as a parallel tuned resonant circuit is tuned by a varying capacitance, the shunt resistance can be made to vary and maintain the bandwidth substantially constant. The shunt resistance must vary in the opposite direction as the variable capacitance, that is, the shunt resistance of the parallel tuned circuit must be made to increase as the parallel tuned circuit is made to resonate at higher frequencies by a decreasing shunt capacitance. While variation in the shunt resistance can be obtained by physically adding or subtracting shunt resistance to thereby maintain a constant bandwidth, this is generally undesirable.

Referring now to FIG. 2a, a source of signals 12 including a signal generator 14 having an internal impedance 16, shown as a resistance, is coupled to a load circuit 18, shown as a resistance 20, by a tunable circuit 22. The tunable circuit 22 includes two serially connected inductors 24 and 26, their junction point 27 being connected to a point of reference potential by the parallel combination of an inductor 28 and a variable capacitor 30, which may be considered a tuning capacitor.

For ease of analysis, the circuit branch which includes resistor 16 and inductor 24 and the circuit branch which includes resistor 20 and inductor 26 can be combined into a single branch as shown in FIG. 2b. The combined circuit branch includes an inductor 32 and a resistor 34 connected between the junction point 27 and a point of reference potential. Since the schematic circuit diagrams shown in FIGS. 2b and 2c will be considered in regard to their resonant frequency and bandwidth, the signal generator 14 may be neglected.

The series connected inductor 32 and resistor 34 can be converted to the equivalent shunt impedances as shown in FIG. 2c by the series-parallel transformation equations. The transformation equations provide:

$$X_p = X_s\left(1+\frac{R_s^2}{X_s^2}\right)$$

and $$R_p = R_s\left(1+\frac{X_s^2}{R_s^2}\right)$$

where $R_p$ is the equivalent shunt resistance of series resistance $R_s$ and $X_p$ is the equivalent shunt reactance of series reactances $X_s$. A complete treatment of series-parallel transformation equation is given in *Electrical Communications*, by Arthur L. Albert on page 72. The transformation equations can be applied to the series components of FIG. 2b to determine the value of the equivalent shunt components in FIG. 2c.

For inductor 32, the equivalent shunt inductance 38 may be obtained from the transformation equation:

$$X_{38} = X_{32}\left(1+\frac{R_{34}^2}{X_{32}^2}\right)$$

however, the inductive reactance of $X_{32}$ and $X_{38}$ can be expressed in the form:

$$X_L = 2\pi fL$$

by making appropriate substitutions and cancelling like terms the equation reduces to:

$$L_{38} = L_{32}\left(1+\frac{R_{34}^2}{4\pi^2 f^2 L_{32}^2}\right)$$

For resistor 34, the equivalent shunt resistance 40 is given by:

$$R_{40} = R_{34}\left(1+\frac{X_{32}^2}{R_{34}^2}\right)$$

however, the inductive reactance of $X_{32}$ can be expressed in the form:

$$X_L = 2\pi fL$$

by making the appropriate substitutions the equation becomes:

$$R_{40} = R_{34}\left(1+\frac{4\pi^2 f^2 L_{32}^2}{R_{34}^2}\right)$$

For inductor 28 and variable capacitor 30, no transformation is necessary because they are in parallel with the series connected inductor 32 and resistor 34 and they, therefore, retain their values in the equivalent parallel tuned resonant circuit shown in FIG. 2c.

From the foregoing equations for the equivalent shunt values of the components shown in FIG. 2c, it will be observed that as variable capacitor 30 is made smaller to tune the circuit to a higher resonant frequency, the equivalent shunt resistance 40 becomes larger. This is because the term $4\pi^2 f^2 L_{32}^2 / R_{34}^2$ in the equation for the equivalent shunt resistance 40 increases as the resonant frequency becomes higher. Moreover, as the frequency increases, the equivalent shunt inductance 38 decreases because of the term $R_{34}^2/4\pi^2 f^2 L_{32}^2$ in the transformation equation. Consequently, the total shunt inductance, which can be expressed in the form $L_{38}L_{28}/(L_{38}+L_{28})$, also decreases. The decreasing shunt inductance with increasing frequency results in a reduction in the range of capacity that is required to make the circuit resonant across a given frequency band and eases design requirements for tuning across a wide band of frequencies.

It should be noted that the schematic circuit diagram shown in FIG. 2a can be modified to be a double-tuned circuit. This may be achieved by placing a second network between the source and load circuits. The second network would be similar to the network including the capacitor 30 and the inductors 24, 26 and 28. The mutual coupling between each of the tuned circuits is supplied by the adjacent inductors. Thus, in the double-tuned circuit configuration, the source and load circuits would be interconnected by four inductors 24, 26 and a new 24′ and 26′ all connected in series.

To demonstrate the manner in selecting the proper component values and, moreover, that when the proper component values are selected for given conditions, the tuned circuit will maintain a substantially constant bandwidth as the circuit resonant frequency is made to vary over a large frequency range by capacitive tuning, an example will be given. First, proper component values will be selected to permit the tuned circuit to resonate throughout the entire television VHF band, 216 to 54 MHz; and then it will be demonstrated that with these component values the effective shunt resistance required for a substantially constant bandwidth which is in excess of the 6-MHz bandwidth typically employed in television tunable circuits is present at both the high and low ends of the VHF band.

For the purpose of the example, at 213 MHz, the center frequency for channel 13 (210 to 216 MHz), a desired bandwidth of 8 MHz and, a minimum value of capacitance for $C_{30}$ of 5 pf. will be chosen (the minimum value of capacitance was chosen to be within the operating range of variable-capacitance diodes). In addition, it will be assumed that resistors 16 and 20 are each equal to 50 ohms and that the inductors 24 and 26 are equal in value. Consequently, the circuit branch including resistor 34 and inductor 32 shown in FIG. 2b, which is the result of combining the circuit branch including resistor 16 and inductor 24 with the circuit branch including resistor 20 and inductor 26, will have component values equal to one-half the value of the components of the actual circuit branches. It should be noted that once the desired component values for inductor 32 and resistor 34 have been determined, other values of circuit components in each of the two branches which combine to give the desired values for inductor 32 and resistor 34 will result in proper operation of the circuit.

The figure of merit $Q_p$ of the parallel tuned resonant circuit can be obtained from the equation:

$$Q_p = f_o/BW$$

$$Q_p = 213\text{ MHz}/8\text{ MHz}$$

$$Q_p = 26.62$$

$Q_p$ is now utilized to obtain the desired value of shunt resistance $R_{40}$ from the equation:

$$Q_p = R_p/X_c$$

which with appropriate substitutions becomes:

$$Q_p = 2\pi f C_{30} R_{40}$$

by substituting component values, the shunt resistance $R_{40}$ may be found. Thus:

$$26.62 = 2(3.14)(213\times10^6)(5\times10^{-12})R_{40}$$

$$R_{40} = 3978.88\text{ ohms}$$

Having obtained the value of $R_{40}$ and having assumed $R_{34}$ equals (½)$R_{16}$ or (½)$R_{20}$ which is 25 ohms, the appropriate value for $L_{32}$ can be determined from the expression:

$$R_{40}=R_{34}\left(1+\frac{4\pi^2f^2L_{32}^2}{R_{34}^2}\right)$$

by substituting component values, the inductance $L_{32}$ may be found. Thus:

$$3978.88=25\left[1+\frac{4(3.14)^2(213\times10^6)^2L_{32}^2}{(25)^2}\right]$$

$$L_{32}=0.235\mu h.$$

Utilizing the value for $L_{32}$, the value of $L_{38}$ the equivalent shunt inductance can be calculated from the expression:

$$L_{38}=L_{32}\left(1+\frac{R_{34}^2}{4\pi^2f^2L_{32}^2}\right)$$

again, by substituting component values, the equivalent shunt inductance $L_{38}$ may be found. Thus:

$$L_{38}=0.235\times10^{-6}\left[1+\frac{(25)^2}{4(3.14)^2(213\times10^6)^2(0.235\times10^{-6})^2}\right]$$

$$L_{38}=0.25\mu h.$$

The appropriate value for $L_{28}$ is obtained from the condition that total shunt inductance $L_T$ must resonate with the capacitance of the shunt capacitor $C_{30}$ at 213 MHz. The conditions for resonance are:

$$X_{LT}=X_C$$

however, inductive reactance can be expressed in the form:

$$X_L=2\pi fL$$

and capacitive reactance can be expressed in the form:

$$X_C=1/2\pi fC_{30}$$

with appropriate substitutions the equation for resonance becomes:

$$2\pi fL_T=1/2\pi fC_{30}$$

by substituting component values, the total inductance $L_T$ may be found. Thus:

$$2(3.14)(213\times10^6)L_T=\frac{1}{2(3.14)(213\times10^6)(5\times10^{-12})}$$

$$L_T=0.114\mu h$$

It is now possible to determine the proper value for $L_{28}$ because the total shunt inductance equals the combined inductance of inductors $L_{38}$ and $L_{28}$. The expression for the total inductance takes the form:

$$L_T=L_{38}L_{28}/(L_{38}+L_{28})$$

by substituting component values, the proper inductance for inductor $L_{28}$ may be found. Thus:

$$(.114\times10^{-6})=\frac{(.25\times10^{-6})L_{28}}{(.25\times10^{-6})+L_{28}}$$

$$L_{28}=0.21\mu h$$

The proper values for all the circuit components shown in FIG. 2*a* have now been determined to establish resonance at 213 MHz with the desired bandwidth: $R_{16}$=50 ohms; $R_{20}$=50 ohms; $L_{24}=2L_{32}$=0.47 $\mu$h.; $L_{26}=2L_{32}$=0.47 $\mu$h.; $L_{28}$=0.21 $\mu$h. and; $C_{30}$=5 pf. (minimum value).

To tune the circuit to resonate at 57 MHz by capacitive tuning, variable capacitor 30 must be made to change to a value of capacitance that will resonate with the total shunt inductance at 57 MHz. As has been shown, the conditions for resonance can be expressed in the form:

$$2\pi fL_T=1/2\pi fC_{30}$$

by substituting component values, the proper capacitance for capacitor $C_{30}$ may be found. Thus:

$$2(3.14)(57\times10^6)(.114\times10^{-6})=\frac{1}{2(3.14)(57\times10^6)C_{30}}$$

$$C_{30}=69.82\text{ pf. (maximum value)}$$

The value of the shunt resistance $R_{40}$ at 57 MHz can be determined from the expression:

$$R_{40}=R_{34}\left(1+\frac{4\pi^2f^2L_{32}^2}{R_{34}^2}\right)$$

by substituting component values, the shunt resistance $R_{40}$ may be found. Thus:

$$R_{40}=(25)\left(1+\frac{4(3.14)^2(57\times10^6)^2(0.235\times10^{-6})^2}{(25)^2}\right)$$

$$R_{40}=308.15\text{ ohms.}$$

Consequently, it has now been established that the tuned circuit will resonate at 57 MHz when the variable capacitor 30 displays a capacitance of 69.82 pf. and, in addition, that the tuned circuit will resonate at 213 MHz when the variable capacitor 30 displays a capacitance of 5.00 pf.

Having selected the proper component values for the tuned circuit, it can now be demonstrated that the shunt resistance $R_{40}$ required to maintain a substantially constant bandwidth is present at both the high and the low end of the VHF band. As previously shown, bandwidth can be expressed in the form:

$$BW=1/2\pi R_{40}C_{30}$$

or, by substituting the expression for the equivalent shunt resistance $R_{40}$, bandwidth can also be expressed in the form:

$$BW=\frac{1}{2\pi\left[R_{34}\left(1+\frac{4\pi^2f^2L^2_{32}}{R^2_{34}}\right)\right]C_{30}}$$

At 213 MHz the bandwidth was selected to be 8 MHz ($R_{40}$=3978.88 ohms and $C_{30}$=5.00 pf.). At 57 MHz, $R_{40}$=308.15 ohms and $C_{30}$=69.82 pf., and by substituting the component values, the equation for bandwidth ($1/2\pi R_{40}C_{30}$) becomes:

$$BW_{57MHZ}=\frac{1}{2(3.14)(308.15)(69.82\times10^{-12})}$$

$$BW_{57MHZ}=7.4MHz$$

The selected and calculated bandwidth ($BW_{213MHz}$=MHz and $BW_{57MHz}$=7.4 MHz) are substantially equal for capacitive tuning at the extreme ends of the VHF band and, moreover, are in excess of the 6-MHz bandwidth typically employed in television tunable circuits. By varying the capacitance of the tuning capacitor $C_{30}$ between 5.00 pf. and 69.82 pf., the tuned circuit, when the proper circuit component values are employed, can be made to resonate over a frequency band which is more than 160 MHz wide with no substantial change in bandwidth. Similar calculations can be made for the selection of component values to permit tuning across the UHF band (890 MHz to 470 MHz).

A circuit as shown in FIG. 2*a*, has been constructed using the component values shown and tested for capacitive tuning across the VHF band. A substantially constant bandwidth was observed ($BW_{213MHz}$=MHz and $BW_{57MHz}$=7.4 MHz). In addition, a circuit as shown in FIG. 2*a* has been constructed and tested for capacitive tuning across the UHF band. The component values used were: $R_{12}$=50 ohms; $L_{24}$=0.1 $\mu$h.; $L_{26}$=0.1 $\mu$h.; $R_{20}$=50 ohms; $L_{28}$=0.008 $\mu$h. and; $C_{30}$=4 pf. (at 890 MHz) and $C_{30}$=14.4 pf. (at 470 MHz). Again, a substantially constant bandwidth was observed experimentally ($BW_{890MHz}$=15 and $BW_{470MHz}$=13).

It should be noted that the circuits shown in FIG. 2 are particularly suited for use with variable-capacitance diodes. Variable-capacitance diodes have an internal resistance which may be represented in FIG. 2 as a resistance in series with the variable capacitor 30. The diode's series resistance presents an equivalent shunt resistance the size of which can be determined by the series-parallel transformation equations. Circuit components can be apportioned such that the diode's equivalent shunt resistance is substantially higher than the equivalent shunt resistance of the source and load circuits. The relationship of the shunt resistances holds across the frequency band, and consequently, it is the equivalent shunt resistance of the source and load circuits which predominates in its effects on the circuit operation.

Reference is now made to FIG. 3 which is a schematic circuit diagram of a UHF tuner embodying the present invention. A tuner 200 includes a mixer stage 202 and a local oscillator stage 204. The tuner 200 is of the type wherein UHF signals are passed through a high-pass filter 206 and a capacitively tuned circuit 208 to be heterodyned in the mixer stage 202 with locally generated signals from the local oscillator stage 204. The IF signal produced by the heterodyne action may be processed by IF signal processing circuits, not shown.

UHF signals (890 to 470 MHz) are intercepted by an antenna (not shown) and coupled to the high-pass filter 206 through a terminal 212. The tuner circuitry is enclosed in a conductive chassis 214 which establishes a point of reference potential, shown as ground.

The high-pass filter 206 includes two inductors 216 and 218 and capacitor 220. Capacitor 220 presents a low-impedance to high-frequency signals which pass from the terminal 212 through the capacitor to the capacitively tuned circuit 208. The shunt inductors 216 and 218 present a high impedance to high-frequency signals, but shunt lower frequency signals to the point of reference potential.

The capacitively tuned circuit 208 includes two serially connected inductors 222 and 224 which interconnect the hgih-pass filter 206 and the mixer stage 202. An inductor 226 and a tuning capacitor 228, shown as a variable-capacitance diode, are connected to the junction 230 of the two inductors 222 and 224. The inductor 226 is connected to the conductive chassis 214. The variable-capacitance diode 228 is connected to the chassis for signal frequencies by means of feedthrough capacitor 232.

The capacitively tuned circuit 208 has circuit components apportioned so that it will be resonant across a band of frequencies ranging from 890 to 470 MHz with a substantially constant bandwidth. Tuning of the circuit 208 is controlled by the direct voltage applied to the diode 228 via resistor 234. The resistor 234 is connected to a voltage divider circuit 236 which is the source of tuning potential for the diode 228. The voltage divider circuit 236 is connected to a stabilized voltage supply 237 which may be designed to develop a voltage of 0 volts and −30 volts at two output terminals. The range of voltage required, however, is dependent upon the specific type of variable-capacitance capacitance diode used.

Automatic frequency control for the tunable resonant circuits of the tuner 200 may be provided by a suitable automatic frequency control circuit 239, shown in block diagram form. It is desirable to provide AFC for all the Varicap tunable resonant circuits of the tuner 200 to correct detuning of the resonant frequency of the circuits due to diode capacitance variations, as for example, with temperature changes. Changes in the voltage applied to the diode 228 are effected by the AFC circuit to maintain the intermediate frequency signal from the mixer 202 at the desired frequency. The DC circuit loop for the diode 228, beginning at a point of reference potential, passes through the AFC circuit 239, the stabilized voltage supply 237, the divider circuit 236, and the resistor 234 to the anode of the diode 228. The DC loop is completed through the inductor 226 which interconnects the cathode of the diode 228 and the point of reference potential.

The inductor 224 is coupled to a mixer diode 238 by a capacitor 240. The junction of the inductor 224 and the capacitor 240 is connected to the chassis by an inductor 242. Capacitor 240 and inductor 242 are apportioned to be series resonant at intermediate signal frequencies. Consequently, IF signals appearing at the anode of diode 238 are shorted to the point of reference potential. At UHF frequencies, however, the inductor 242 displays high impedance and the UHF signals pass from the capacitively tuned circuit 208 through the capacitor 240 to the anode of the diode 238. Bias for the mixer diode 238 is obtained through a radiofrequency choke 244 coupled between the anode of diode 238 and a voltage-dividing network including the resistors 246 and 248.

The local oscillator stage 204 includes a transistor 250 which is connected as the active element of the oscillator circuit. The transistor 250 along with other portions of the oscillator circuitry is enclosed in a conductive casing 252 which may be a portion of the tuner chassis 214. The collector electrode of the transistor 250 is connected to a source of operating potential applied at a terminal 254 by a radiofrequency choke 256. Two resistors 258 and 260 are serially connected between the terminal 254 and the point of reference potential. The junction of the resistors is connected to the base electrode of the transistor 250 to provide the necessary base bias. Two feedthrough capacitors 262 and 264 prevent any radiofrequency signals from passing from the base and collector electrodes of the transistor 250 into the source of operating potential applied at the terminal 254. The emitter electrode of the transistor 250 is connected to the point of reference potential by the series connection of a resistor 266 and an inductor 268.

The frequency of operation of the oscillator circuit is determined by a first transmission line comprising an inner conductor 270 and an outer conductor formed by conductive casing 252 and a second transmission line comprising an inner conductor 272 and an outer conductor formed by conductive casing 252. A variable tuning capacitor 274, shown as a variable-capacitance diode, interconnects the inner conductors 270 and 272 of the transmission lines.

The collector electrode of the transistor 250 is coupled to the transmission line conductor 270 by a capacitor 276 to provide coupling between the transistor and the frequency-determining network. The coupling provided by the capacitor 276 may be such that the transistor is loosely coupled to the frequency-determining network so that changes in the output impedances of the transistor cause a relatively small effect on the frequency-determining network of the oscillator circuit.

Tuning of the oscillator frequency-determining network is controlled by the direct voltage applied to the diode 274 via resistor 278 and inner conductor 270. The resistor 278 is connected to a voltage divider circuit 236 which is the source of tuning potential for the diode 274. A feedthrough capacitor 280 prevents radiofrequency signals from entering the source of tuning potential. The DC circuit loop for the diode 274, beginning at a point of reference potential, passes through the AFC circuit 239, the stabilized voltage supply 237, the divider circuit 236, the resistor 278, and the inner conductor 270 to the anode of the diode 274. The DC loop is completed through the inner conductor 272 which interconnects the cathode of the diode 274 and the point of reference potential.

Locally generated signals from the oscillator stage 204 are inductively coupled to the mixer diode 238 by means of a coupling loop 282 connected in series with the cathode of the mixer diode. A window 284 in the conductive casing 252 permits the field established by the local oscillator to pass from the oscillator compartment to the coupling loop 282.

The UHF signals and the locally generated signals are heterodyned in the mixer diode 238 to produce an IF signal. The IF signals are coupled to an output terminal 286 by a series peaking network. Included in the peaking network are an inductor 288 and a feedthrough capacitor 290 selected to be series resonant at intermediate signal frequencies. In addition to their peaking function, the capacitor 290 completes the radiofrequency signals circuit path connecting one end of coupling loop 282 to the point of reference potential, while the inductor 288 acts as a radiofrequency choke.

By selecting the voltage of the source of tuning potential 236 by movement of the tap, the capacitively tuned circuit 208 can be made to resonate at a desired frequency. Specifically, the capacitively tuned circuit 208 can be made to resonate anywhere within the UHF television band of 890 to 470 MHz. Simultaneously, the capacitively tuned oscillator circuit can be made to resonate anywhere within a range from 931 to 517 MHz. It should be noted that since the variable-capacitance diodes 228 and 274 obtain their bias from one supply, a "ganging" effect is achieved in tuning the capacitively tuned circuits.

What is claimed is:

1. In a VHF television tuner wherein VHF television signals are heterodyned in a mixer stage with locally generated signals from an oscillator stage to produce an intermediate frequency signal, an electric circuit comprising:

an input and an output tunable resonant circuit adapted to maintain a bandwidth of at least 6 MHz at all its tunable frequencies, each tunable resonant circuit including a first and a second inductor connected in series and a variable capacitor and a third inductor connected to form a resonant circuit, said resonant circuit coupled between the junction of said first and said second inductor and a point of reference potential;

a first transistor having a base electrode, a collector electrode and an emitter electrode and connected to form a grounded base amplifier;

said input tunable resonant circuit first and second inductors coupled between a source of VHF television signals and the emitter electrode of said first transistor;

a second transistor having a base, a collector and an emitter electrode;

a wideband tuned circuit interconnecting the collector electrode of said first transistor and the base electrode of said second transistor; and said output tunable resonant circuit first inductor and second inductor coupled between one of said second transistor collector and emitter electrodes and said mixer stage.

2. An electric circuit as defined in claim 1 wherein said input and output tunable resonant circuits are tunable across a band of frequencies ranging from 216 to 54 MHz.

3. An electric circuit as defined in claim 2 wherein said resonant circuit is a parallel resonant circuit.

4. An electric circuit as defined in claim 3 wherein said variable capacitor is a voltage dependent variable-capacitance device.

5. In a UHF television tuner wherein UHF television signals are heterodyned in a mixer stage with locally generated signals from an oscillator stage to produce an intermediate frequency signal, an electric circuit comprising:

a first filter network adapted to pass signals above a predetermined frequency coupled to a source of UHF television signals;

a second filter network coupled to said mixer stage;

a tunable resonant circuit adapted to maintain a bandwidth of at least 6 MHz at all its tunable frequencies and including a first and a second inductor connected in series and a variable capacitor and a third inductor connected to form a resonant circuit coupled between the junction of said first and said second inductor and a point of reference potential; and said tunable resonant circuit first and second inductors coupled between said first and said second filter networks.

6. An electric circuit as defined in claim 5 wherein said tunable resonant circuit is tunable across a band of frequencies ranging from 890 to 470 MHz.

7. An electric circuit as defined in claim 6 wherein said resonant circuit is a parallel resonant circuit.

8. An electric circuit as defined in claim 7 wherein said variable capacitor is a voltage-responsive variable-capacitance device.

9. An electric circuit as defined in claim 8 wherein said second filter network is resonant at said intermediate frequency.

* * * * *

UNITED STATES PATENT OFFICE
CERTIFICATE OF CORRECTION

Patent No. 3,628,152 Dated December 14, 1971

Inventor(s) David J. Carlson

It is certified that error appears in the above-identified patent and that said Letters Patent are hereby corrected as shown below:

In Column 3, line 35, delete "variable-capacitance" and substitute therefor -- oscillator --. Column 6, lines 3-4, "$4\pi^2 f^2 L_{32}{}^2 34^2$" should read -- $4\pi^2 f^2 L_{32}{}^2 / R_{34}{}^2$ --. Column 7, line 27, "$X_{LT} = X_C$" should read -- $X_{LT} = X_{C_{30}}$ --; line 34, that portion of the formula reading "$2\pi f L_1$" should read -- $2\pi f L_T$ --. Column 8, line 35, "$BW_{213MHz}$ = MHz" should read -- $BW_{213MHz}$ = 8 MHz --; line 51, "$BW_{213MHz}$ = MHz" should read -- $BW_{213MHz}$ = 8 MHz --. Column 9, line 40, delete "variable-capacitance" and substitute therefor -- variable --.

Signed and sealed this 22nd day of August 1972.

(SEAL)
Attest:

EDWARD M.FLETCHER,JR.
Attesting Officer

ROBERT GOTTSCHALK
Commissioner of Patents